(12) United States Patent
Tower et al.

(10) Patent No.: US 7,755,685 B2
(45) Date of Patent: Jul. 13, 2010

(54) ELECTRON MULTIPLICATION CMOS IMAGER

(75) Inventors: John Robertson Tower, Yardley, PA (US); James Tynan Andrews, Hopewell, NJ (US)

(73) Assignee: Sarnoff Corporation, Princeton, NJ (US)

( * ) Notice: Subject to any disclaimer, the term of this patent is extended or adjusted under 35 U.S.C. 154(b) by 461 days.

(21) Appl. No.: 11/863,945

(22) Filed: Sep. 28, 2007

(65) Prior Publication Data
US 2009/0086055 A1 Apr. 2, 2009

(51) Int. Cl.
*H01L 31/107* (2006.01)
*H01L 31/08* (2006.01)
(52) U.S. Cl. .................. 348/294; 348/241; 348/297; 348/311; 257/217; 257/223; 257/229; 257/438; 250/207; 250/208.1
(58) Field of Classification Search ............ None
See application file for complete search history.

(56) References Cited

U.S. PATENT DOCUMENTS

| | | | |
|---|---|---|---|
| 5,285,310 A | 2/1994 | Miller et al. | |
| 5,337,340 A * | 8/1994 | Hynecek | 377/60 |
| 6,169,318 B1 | 1/2001 | McGrath | |
| 6,444,968 B1 | 9/2002 | Burt et al. | |
| 6,825,059 B2 | 11/2004 | Fossum | |
| 7,183,555 B2 | 2/2007 | Jarron | |
| 2001/0017786 A1* | 8/2001 | Woodward | 365/120 |
| 2001/0020673 A1* | 9/2001 | Zappa et al. | 250/214 R |
| 2002/0024058 A1* | 2/2002 | Marshall et al. | 257/170 |
| 2004/0036786 A1* | 2/2004 | Takayanagi et al. | 348/308 |
| 2005/0056771 A1* | 3/2005 | Atlas et al. | 250/208.1 |
| 2008/0048212 A1* | 2/2008 | Nakashima et al. | 257/222 |

OTHER PUBLICATIONS

S. Gager, "Avalanche Gain In Charge Coupled Devices," submitted to the Massachusetts Institute of Technology (1986).

* cited by examiner

*Primary Examiner*—David L Ometz
*Assistant Examiner*—Dwight Alex C Tejano
(74) *Attorney, Agent, or Firm*—Lowenstein Sandler PC (57) ABSTRACT

A pixel for an imager is disclosed that includes at least one electron multiplication (EM) gain stage configured in a loop and electrically coupled to a charge collection region and a charge readout region, the charge collection region being configured to generate a charge packet, the EM gain stage being configured to amplify the charge packet by impact ionization and to circulate the charge packet a predetermined number of times in one direction around the loop, the charge readout region being configured to receive the amplified charge packet and convert the amplified charge to a measurable signal. The at least one EM gain stage, the charge collection region, and the charge readout region can be formed monolithically in an integrated circuit. The pixel can be manufactured using a CMOS process. The pixel can further include a second EM gain stage formed in the integrated circuit to increase the amount of amplification around the loop.

23 Claims, 10 Drawing Sheets

ELECTRON MULTIPLICATION CMOS IMAGER

FIELD OF THE INVENTION

The present invention relates generally to imaging systems, and more particularly to the design of a CMOS-based imaging pixel which employs a form of electron multiplication (impact ionization) gain.

BACKGROUND OF THE INVENTION

A ubiquitous image sensor technology used in digital cameras is the charge-coupled device (CCD) imager. In a typical CCD imager, signal charge representative of incident radiation is accumulated in an array of pixels in an image area. Following an integration period, the signal charge is transferred to an output register by applying appropriate clocking or drive pulses to control electrodes. The signal charge is then read out from the output register and applied to a charge detection circuit to produce a voltage, which is representative of the amount of signal charge.

Figure 1A:
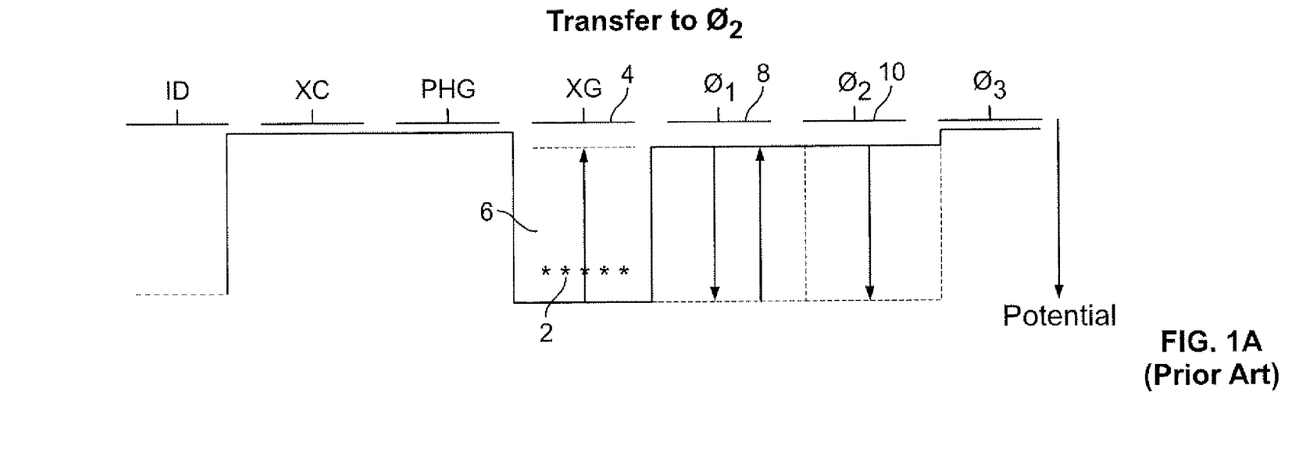
FIGS. 1A and 1B depicts schematic cross-section of CCD gates and accompanying applied potential diagrams which illustrate the principle of impact ionization resulting in electron multiplication as outlined in the Gager paper of the prior art.
Figure 1B:
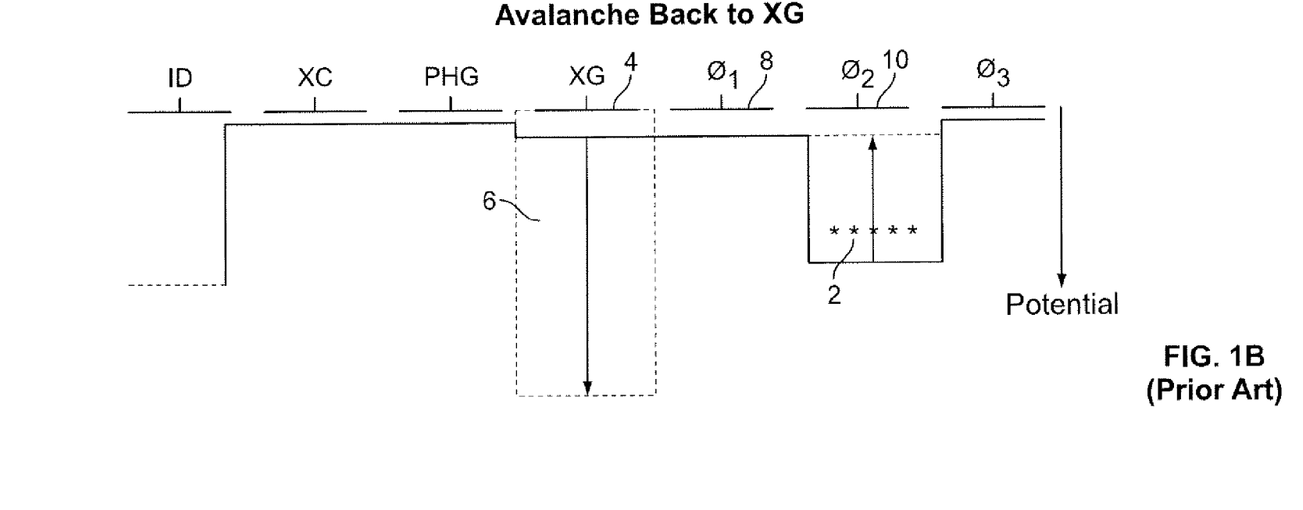

It has been found that, with the application of proper gate potentials, a form of gain via impact ionization can be achieved in a CCD device. In a thesis entitled "Avalanche Gain In Charge Coupled Devices," submitted to the Massachusetts Institute of Technology in August of 1986, Stephanie A. Gagar (hereinafter "Gager") suggested the incorporation of an avalanche multiplication of charge on a charge coupled device. Referring now to FIG. 1A, charge 2 is collected and accumulated under a gate 4 in a potential well 6. The accumulated charge 2 is then transferred through an intermediate gate 8 to a storage gate 10 where it is temporarily stored. The original gate 4 wherein the charge was first accumulated is then biased into avalanching. Referring now to FIG. 1B, charge is then transferred back from the temporary holding gate 10 to the accumulating gate 4 which is now biased as an avalanching gate. This is accomplished by pulsing the holding gate 10 to a lower potential and transferring the charge through the intermediate gate 8 to the avalanching region. For further gain, this procedure is repeated multiple times, i.e. 100 to 500 times, to build up charge. The gain per avalanche transfer is roughly 1.015×. The gain after N avalanche transfers is roughly $(1.015)^N$, For N equal to 400, the resulting gain is about 386. Once sufficient charge has been built up, the charge is moved off of the CCD gates to a charge sensitive amplifier for amplification and read out.

Figure 2:
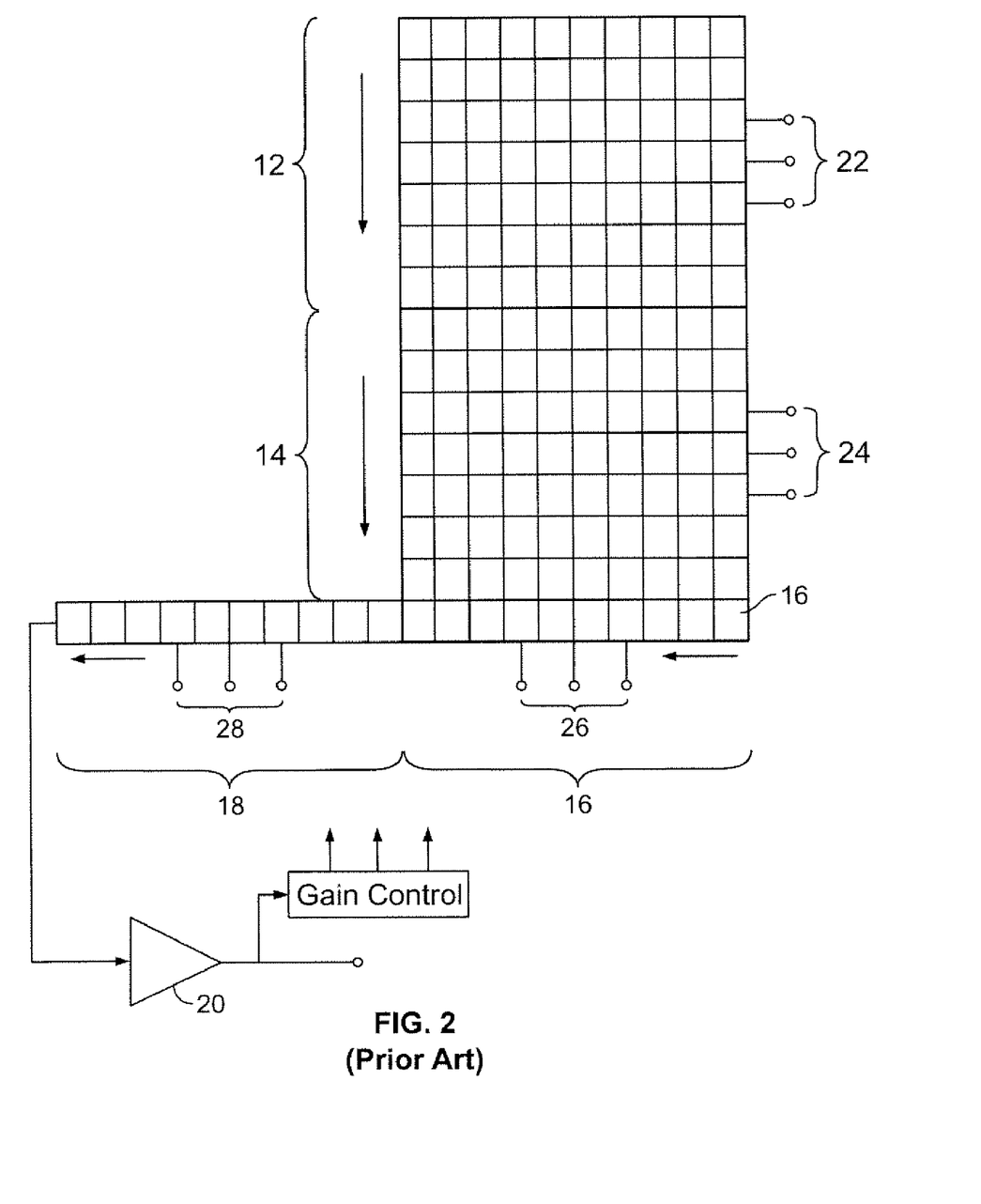
FIG. 2 is a block diagram of the Burt et al. CCD imaging architecture of the prior art.

A second design employing impact ionization can be found in U.S. Pat. No. 6,444,968 to Burt et al. (hereinafter "Burt et al."). The Burt et al. CCD imaging architecture is depicted in FIG. 2. The Burt et al. CCD comprises an image area 12 containing a plurality of pixels, a store section 14 and an output or read-out register 16. The output register 16 is extended in a linear direction to a serial electron multiplication register 18, the output of which is connected to a charge detection circuit 20.

During operation of the device, incident radiation is converted at the image area 12 into signal charge. Following the image acquisition (integration) period, drive pulses are applied to control electrodes 22 to transfer the charge accumulated at the pixels of the image area 12 to the store section 14. Simultaneously with this, drive signals are also applied to control electrodes 24 at the store section 14 to cause charge to be transferred from row to row, the last row of charge being transferred in parallel to the output register 16.

When a row of signal charge has been transferred into the output register 16, appropriate drive pulses are applied to the electrodes 26 to sequentially transfer the charge from the elements of the output register to those of the electron multiplication register 18. To achieve multiplication of charge in each of the elements of the multiplication register 18, sufficiently high amplitude drive pulses are applied to control electrodes 28 to both transfer signal charge from one element to the next adjacent element and also to increase the level of signal charge by an amount determined by the amplitude of the drive pulses. Each signal charge packet stored in the output register 20 undergoes an identical multiplication process as each travels through all the elements of the multiplication register 18, thereby providing an overall high gain.

Unfortunately for the Burt et al. design, the increasing demand from the consumer market to supply higher and higher resolution CCD cameras has required designers to increase the number of pixels in the CCD image sensors that are used in these products. At the same time the competitive pressures to maintain or reduce the cost of these sensors necessitate the reduction of chip size and consequently the reduction of the active pixel area. The separate imaging area and storage area in the Burt et al. design goes against this trend, resulting in a large size imager that is costly.

Accordingly, what would be desirable, but has not yet been provided, is a solid state imager which provides the functionality of both CCD imaging arrays and amplification at a reduced overall footprint and cost.

SUMMARY OF THE INVENTION

The above-described problems are addressed and a technical solution is achieved in the art by providing at least one electron multiplication (EM) gain stage configured in a loop and electrically coupled to a charge collection region and a charge readout region, the charge collection region being configured to generate a charge packet, the EM gain stage being configured to amplify the charge packet by impact ionization and to circulate the charge packet a predetermined number of times in one direction around the loop, the charge readout region being configured to receive the amplified charge packet and convert the amplified charge to a measurable signal. The at least one EM gain stage, the charge collection region, and the charge readout region can be formed monolithically in an integrated circuit at each pixel.

The pixel can be manufactured using a CMOS process, preferably a pinned photo-diode CMOS process. The pixel can further include a second, third, fourth, etc., EM gain stage formed in the integrated circuit to provide more amplification around die loop. The pixel can further comprise an optical-to-charge conversion device, such as a pinned photodiode (PPD) or photogate (PG), for collecting the charge packet upon incidence of photons; a floating diffusion sense node for receiving the charge packet after circulating in the gain region and for converting the charge packet to a voltage; and a readout structure electrically connected to the floating diffusion output amplifier; wherein the PPD or PG and the floating diffusion output amplifier (sense node) are electrically coupled to the at least one EM gain region.

For front side illumination, an optically opaque shield can be placed above all regions of the pixel except for the pinned photodiode or photogate, above which a color filter and/or a microlens could be placed. For back side illumination, all of the circuits except the pinned photodiode or photogate can be placed in a doped well of higher doping than the substrate doping to keep the photo charge away from charge collection by these circuits. A color filter and/or a microlens could be placed on the back side of the pixel.

The EM gain stage comprises a first clocked gate, a second clocked gate, and a DC gate formed between the first clocked gate and said second clocked gate, wherein when a first voltage is applied to the first clocked gate, a first charge well is formed below the first clocked gate; when a second voltage greater than the first voltage is applied to the second clocked gate, a second charge well that is deeper than the first charge well is formed below the second clocked gate; when a DC voltage less than the first and second voltages is applied to the DC gate, a charge barrier is formed between the first charge well and the second charge well; and when a third potential is applied to the first clocked gate that is less than said DC voltage, the charge packet undergoes impact ionization as it transfers from the first charge well to said second charge well. The EM gain register further comprises a second DC gate formed proximal to the first clocked gate and distal to the second clocked gate, wherein the first DC gate and the second DC gate are combined with a step potential profile under the first clocked gate and the second clocked gate so as to set a direction of flow of the charge packet around the loop.

A plurality of pixels can be incorporated in an imaging array, which also includes a plurality of row selection lines coupled to the plurality of readout structures for selecting voltages present on a row of floating diffusion sense nodes; a plurality of amplifiers for receiving and amplifying floating diffusion sense voltages from the plurality of pixels via one of the plurality of row selection lines; wherein the PPD or PG and the floating diffusion sense node are electrically coupled to the EM gain region. The imaging array can also include a column-bus amplifier with column load and a column select multiplexer coupled to the plurality of readout structures for selecting one of the voltages present at the output of one of the amplifiers; and an output buffer coupled to said column select multiplexer for buffering and outputting the selected output voltage.

BRIEF DESCRIPTION OF THE DRAWINGS

The present invention will be more readily understood from the detailed description of exemplary embodiments presented below considered in conjunction with the attached drawings, where like structures have like reference numerals, of which.

It is to be understood that the attached drawings are for purposes of illustrating the concepts of the invention and may not be to scale.

DETAILED DESCRIPTION OF THE INVENTION

Figure 3A:
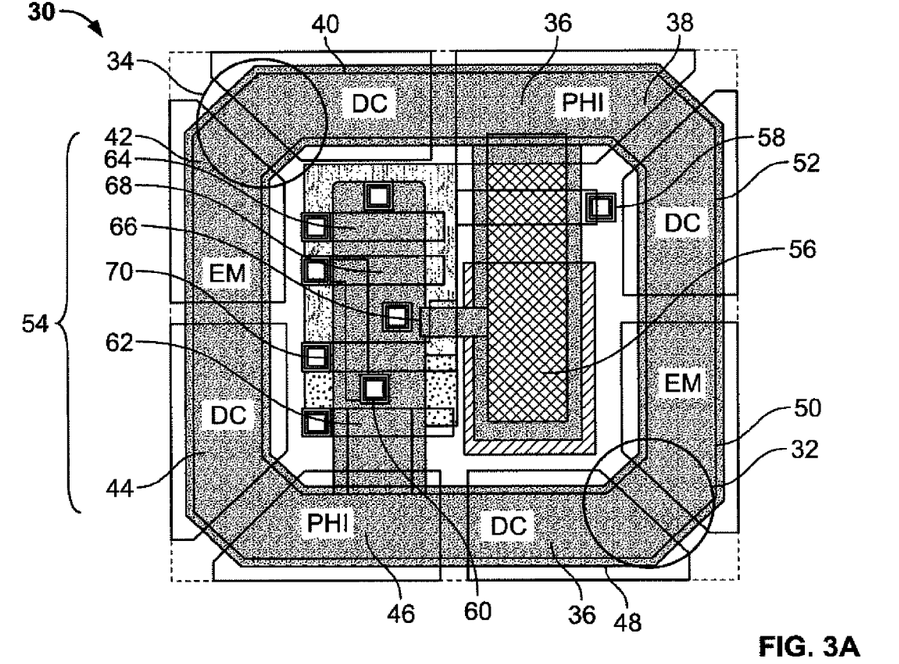
FIGS. 3A and 3B are plan views of an EMCMOS pixel layout and architecture, constructed in accordance with an embodiment of the present invention.
Figure 3B:
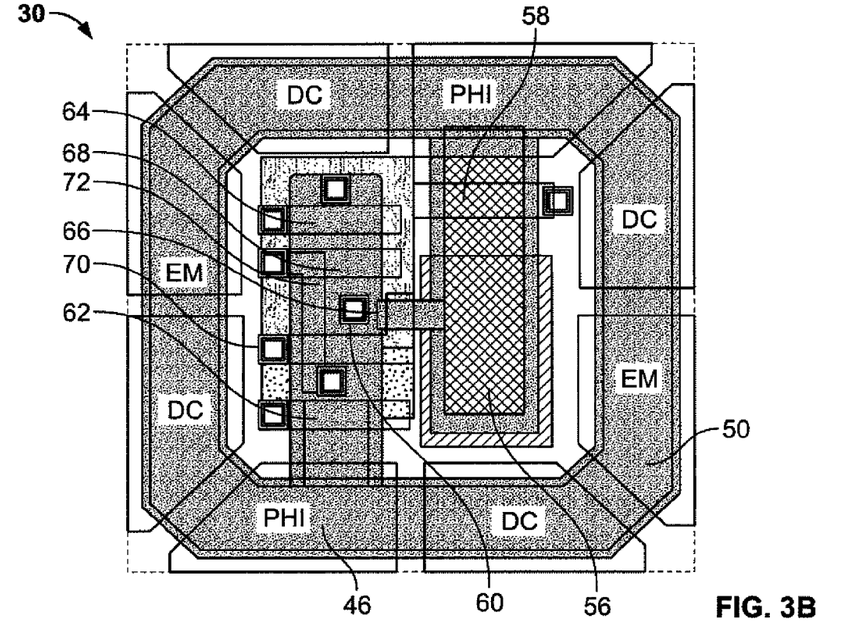

Referring now to FIGS. 3A and 3B, plan views of an EMCMOS device layout and architecture is depicted. Rather than having separate charge collection, storage, and electron multiplication (EM) regions, all three functions are incorporated into a single pixel 30 formed monolithically as an integrated circuit. The pixel 30 includes one or more electron multiplication (EM) gain regions 32, 34 whose accumulated charge circulates around an enclosed track or circulating register called the EM gain register 36. In FIGS. 3A, 3B, there are a total of eight gates which constitute two stages of the EM gain register 36: PHI (clocked gate) 38, DC gate 40, EM (high voltage clocked gate) 42, DC gate 44, PHI 46, DC Gate 48, EM 50, and DC Gate 52. A readout structure 54 comprising a number of sub-structures are fabricated in the pixel 30 nested within the EM gain register 36. The light sensitive area, which creates electrons in proportion to the radiant energy incident on the pixel 30 can be an optical-to-charge conversion device such as a pinned photodiode (PPD) 56 as shown, a photogate, a conventional photodiode, etc. The PPD 56 is connected to and releases the accumulated charge to the EM gain register 36 by means of a PDD transfer gate (TR1) 58. A floating diffusion sense node 60 for receiving amplified charge from the EM gain register 36 and for converting the charge to a voltage is also connected to the EM gain register 36 by means of a floating diffusion transfer gate (TR2) 62. The readout circuitry 54 includes a row select gate 64, a PPD reset gate 66, a source follower transistor 68, and a source follower reset gate 70. Power is supplied to the pixel 30 by means of power rail VDD 72. The pixels 30 and a resulting array to be described in connection with FIG. 7 can be manufactured using a CMOS process, preferably a PPD CMOS process. The PPD CMOS approach allows for very high charge transfer efficiency with no measurable loss for single transfers down to signal levels below 10 electrons. One advantage of using CMOS technology compared to CCD technology is that a lower amplitude clock can be utilized to achieve a required gain given a much thinner gate dielectric and higher attendant electric fields. The size of the pixel 30 is as small as 8 um×8 um using 0.18 um CMOS technology.

The pixel 30 can be configured to operate as part of a front illuminated imager or a back illuminated imager. For front side illumination, an optically opaque shield (not shown) can be placed above all regions of the pixel 30 except for the pinned photodiode or photogate 56, above which a color filter and/or a microlens could be placed. For back side illumination, all of the circuits (i.e., the at least one EM gain stage 36 and the charge readout region 54) except for the pinned photodiode or photogate 56 can be placed in a doped well of higher doping than the substrate doping to keep the photo charge away from charge collection by these circuits. A color filter and/or a microlens could be placed on the back side of the pixel 30.

Figure 4A:
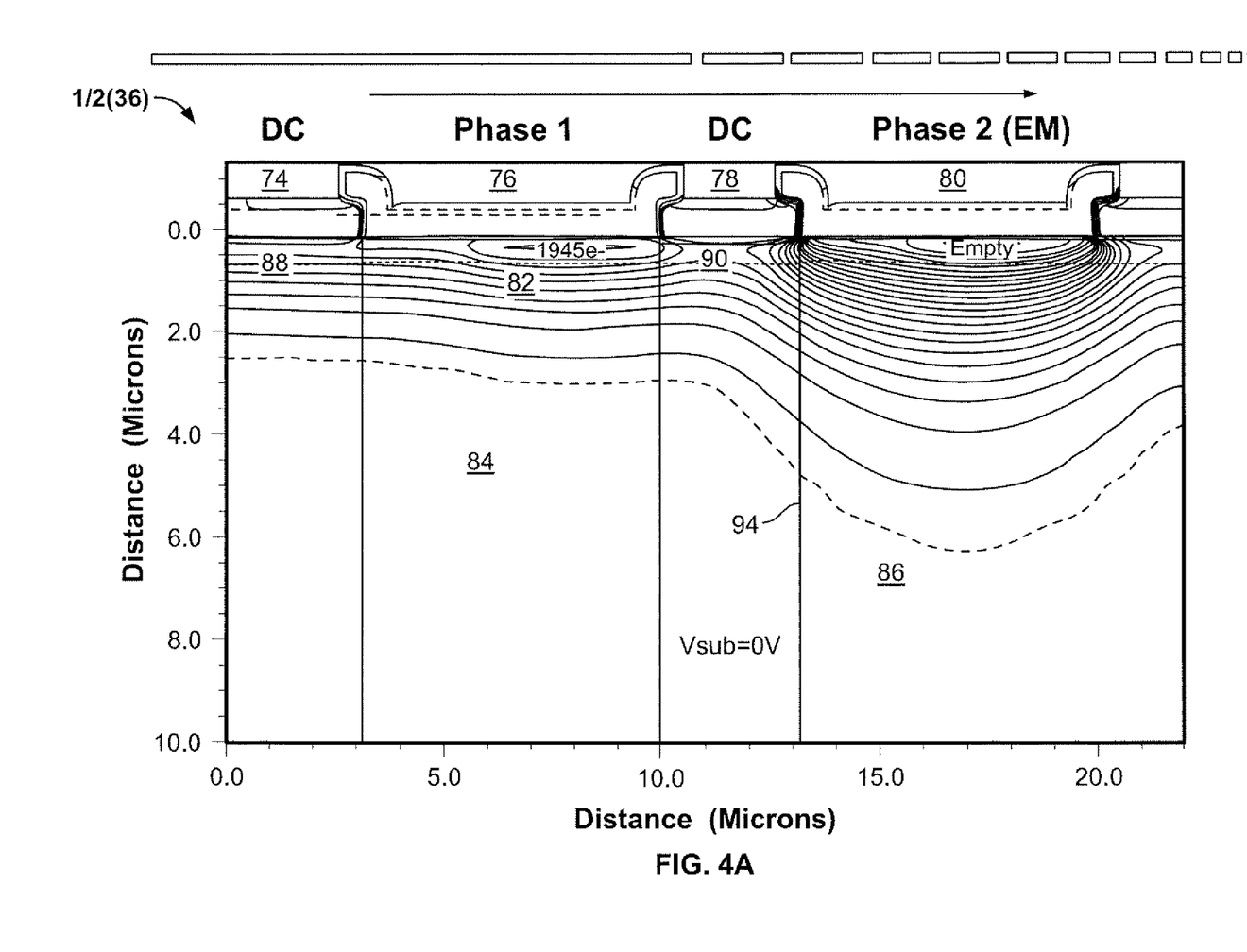
FIGS. 4A-4C depict a schematic cross-section of the electron multiplication gates and accompanying applied potential diagrams of the pixel of FIGS. 3A and 3B.
Figure 4B:
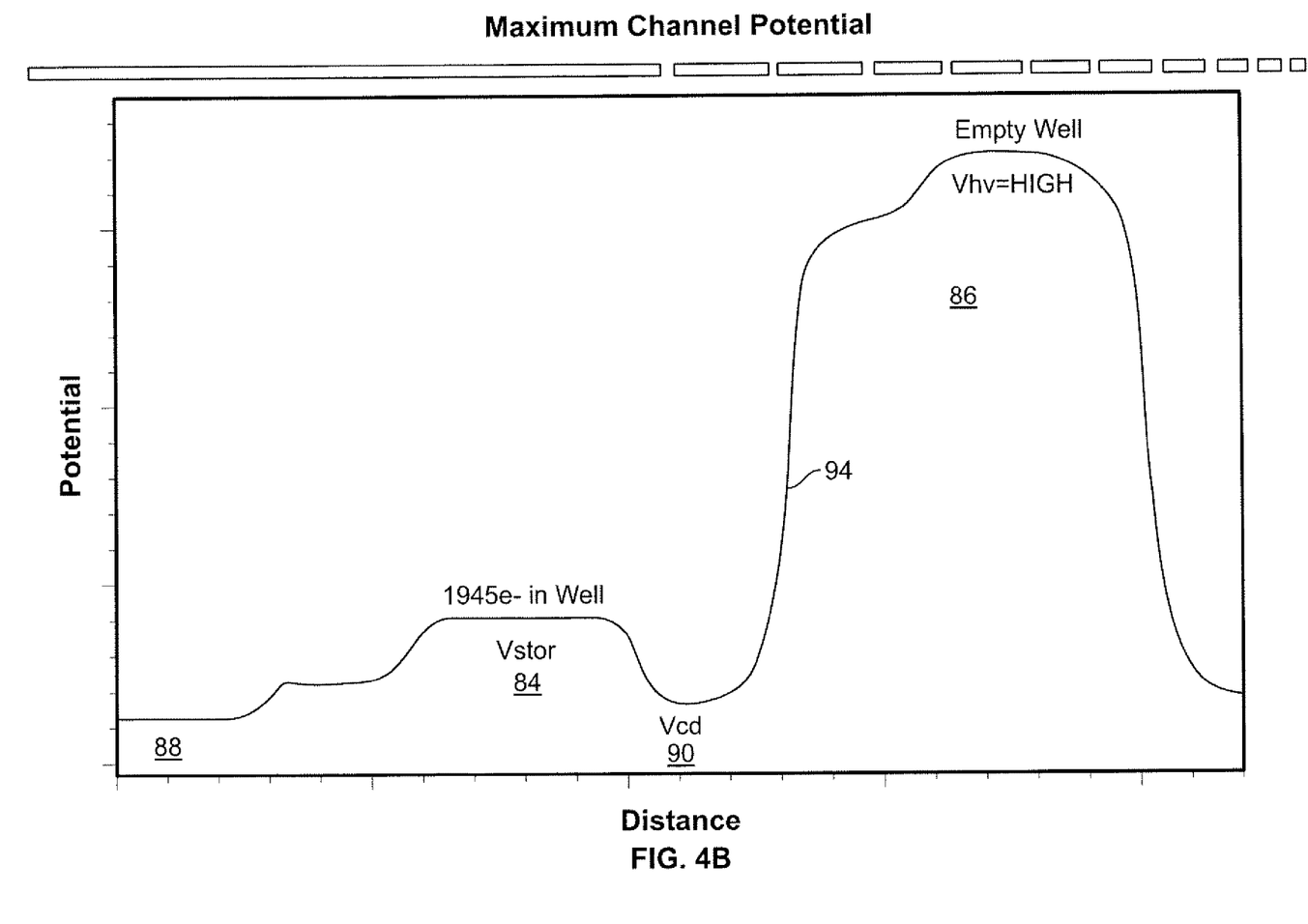
Figure 4C:
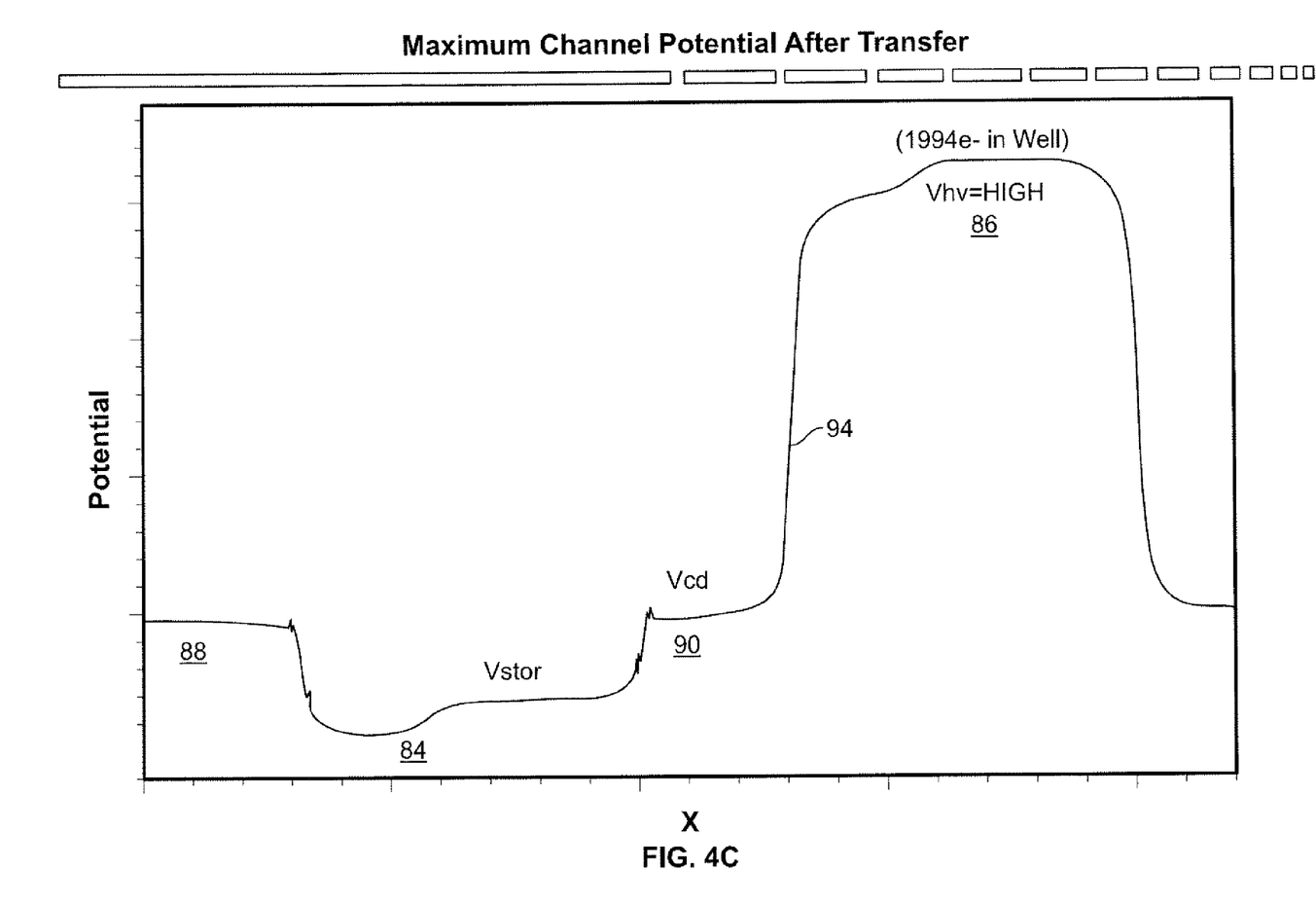

Referring now to FIGS. 4A-4C, a schematic cross-section of one stage (4 gates) of the (EM) gain register 36 and accompanying applied potential diagrams of the pixel 30 is depicted. Each EM gain stage includes four gates: a first DC gate 74, a phase 1 clock gate 76, a second DC gate 78, and a phase 2 clock gate 80 which is employed to control the electron multiplication function. The clocking of the EM gain register 36 is done with two clock phases, as shown in FIG. 4A. During a first clock period shown in FIG. 4B, the phase 1 clock gate 76 has a potential of about 10 V applied to it to hold the accumulate charge (electrons) in a charge packet 82 in a potential well 84 below the phase 1 clock gate 76. Meanwhile, a larger potential of about 10-25V is applied to the phase 2 clock gate 80 to create a potential well 86, which is initially devoid of charge. Barrier regions 88, 90 are created below the DC gates 74, 78, respectively, to assure proper direction of charge transfer between the clock gates 76, 80 and between the (EM) gain regions 32, 34 by the application of appropriate low DC voltage levels relative to the high voltages applied to the clock gates 76, 80 when they are in their high (on) state. During a second clock cycle shown in FIG. 4C, the potential of the phase 1 clock gate 76 is changed to about 0 volts which is lower than the potential applied to the DC gates 74, 78. Electrons that have accumulated below the phase 1 gate clock 76 now "spill" over into the well 86 and can undergo impact ionization at the interface 94 between the second DC gate 78 and the phase 2 clock gate 80. As a result, the electron charge packet 82 transfers to the well 86. Proper directionality is achieved by optimized implants.

The electrons in a charge packet 82 are made to circulate a predetermined number of times through the EM gain regions 32, 34 in the pixel 30. Although the probability of impact ionization, and thus the mean gain per stage g for each of the EM gain regions 32, 34 is low, the number of times that the charge packet 82 pass around the EM gain registers 36 and through EM gain regions 32, 34 in the pixel 30, designated as N, can be high. The total gain of the cascaded multiplication elements (EM gain regions 32, 34) is given by $M=g^N$. For N=600 and g=1.015 (1.5 percent probability of impact ionization), the total gain in the charge domain is over 7500 ×.

Figure 5:
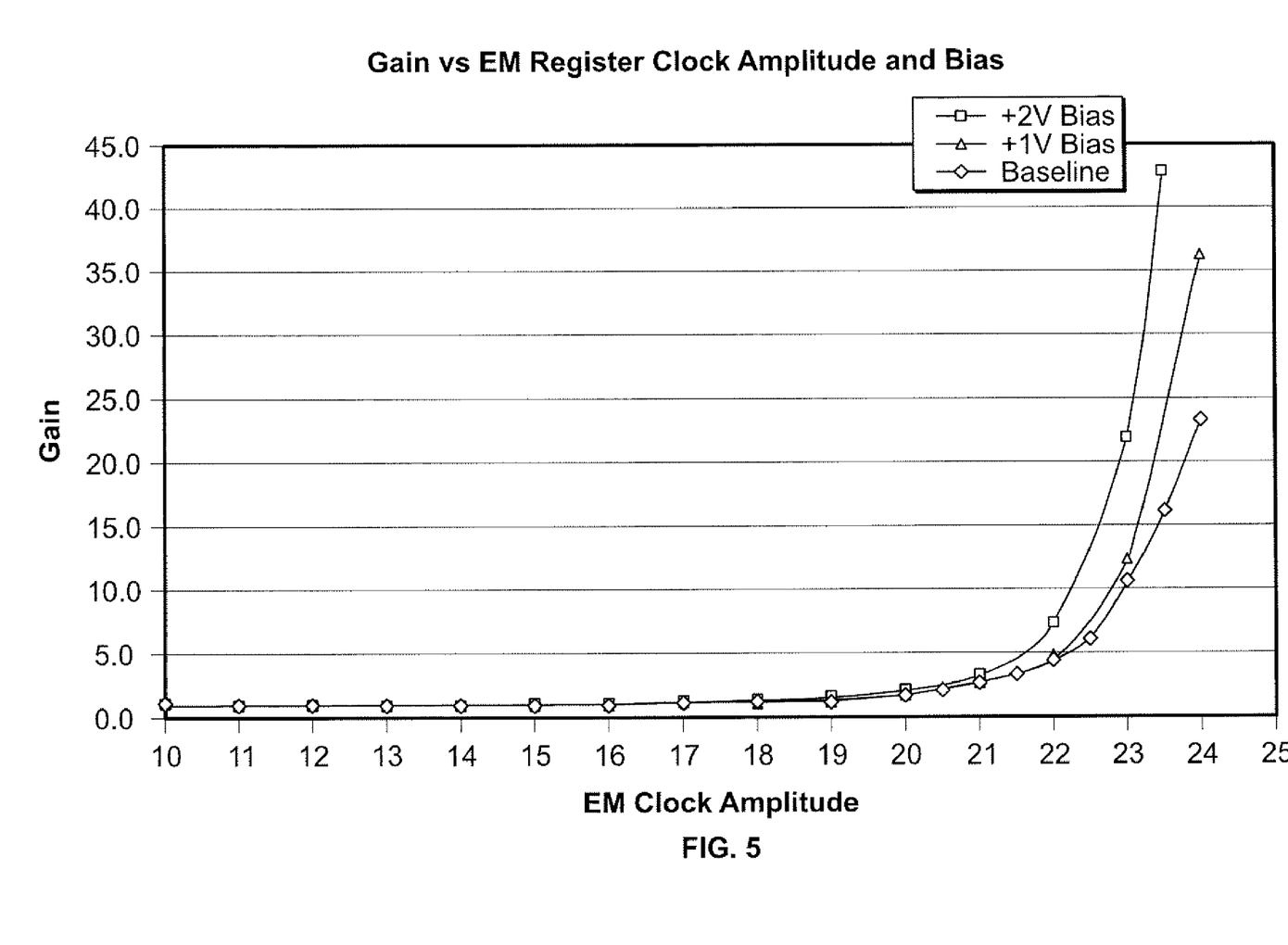
FIG. 5 is a plot of measured charge multiplication gain as a function of clock amplitude for an experimental CCD register with 400 stages, demonstrating the gain mechanism in an embodiment of the present invention.
Figure 6A:
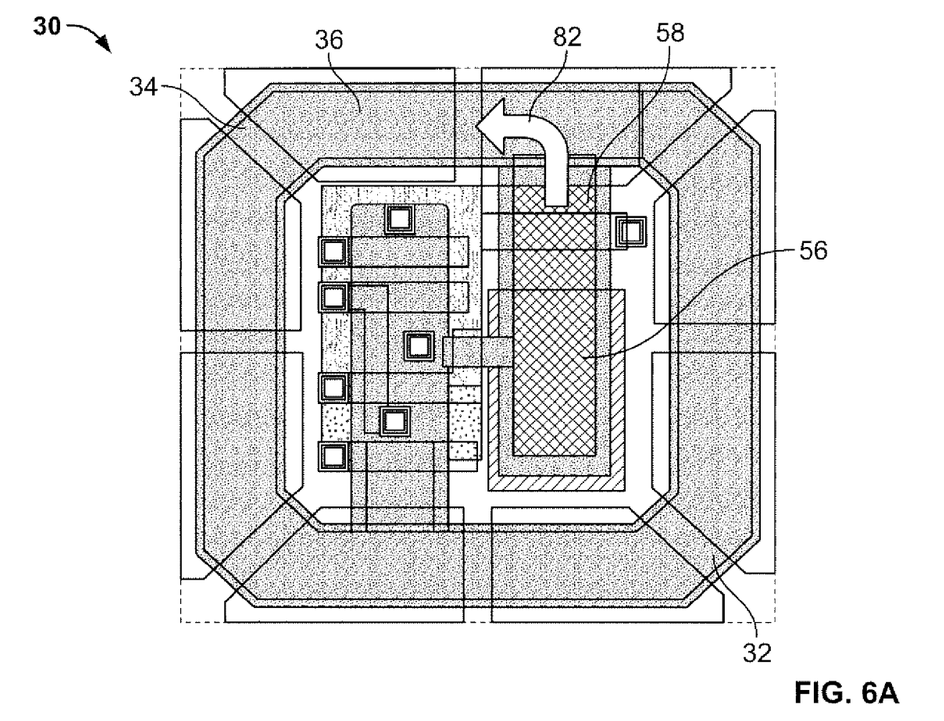
FIGS. 6A-6D illustrate the operation of the pixel of FIGS. 3A and 3B.
Figure 6B:
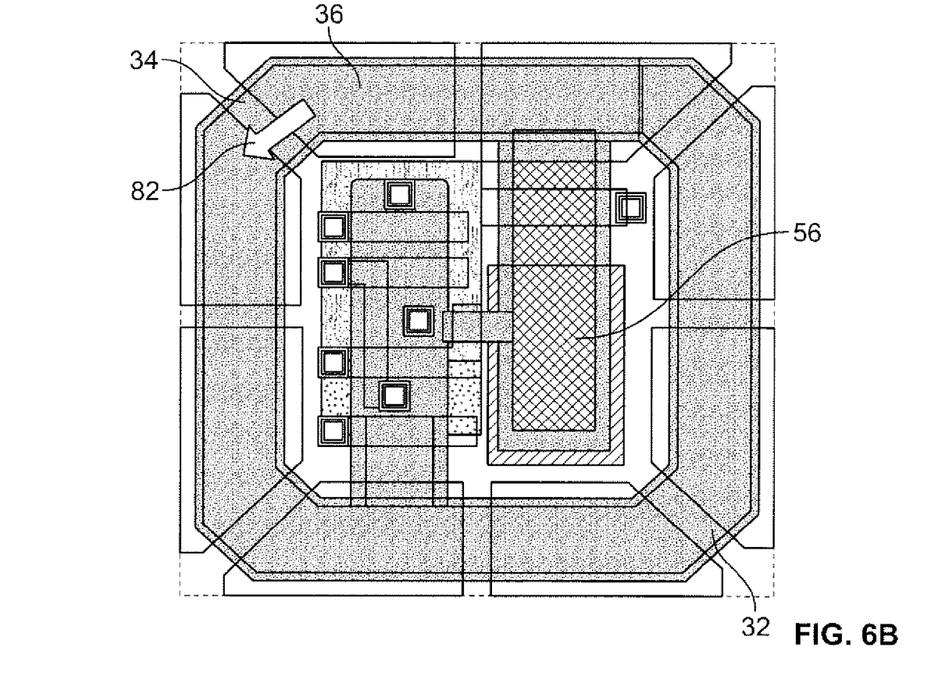
Figure 6C:
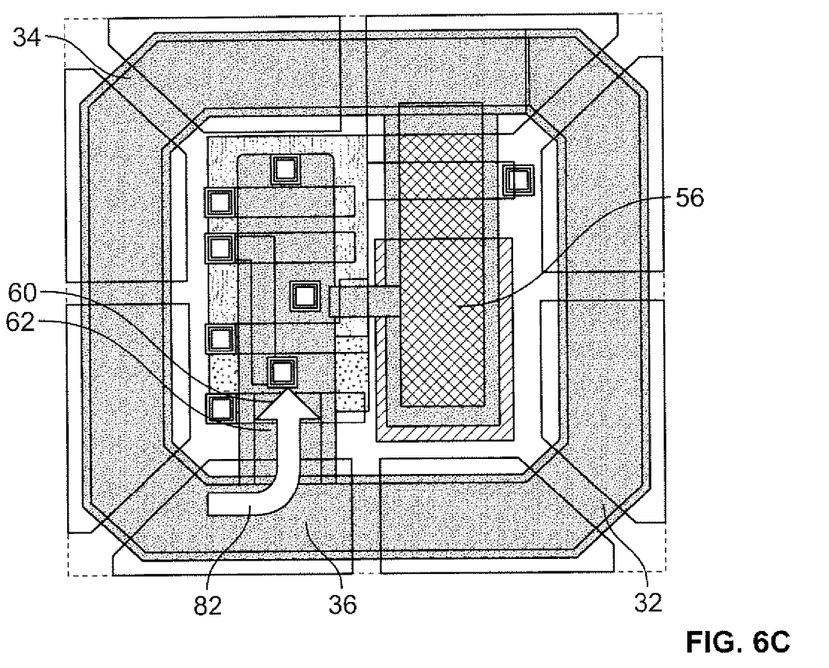
Figure 6D:
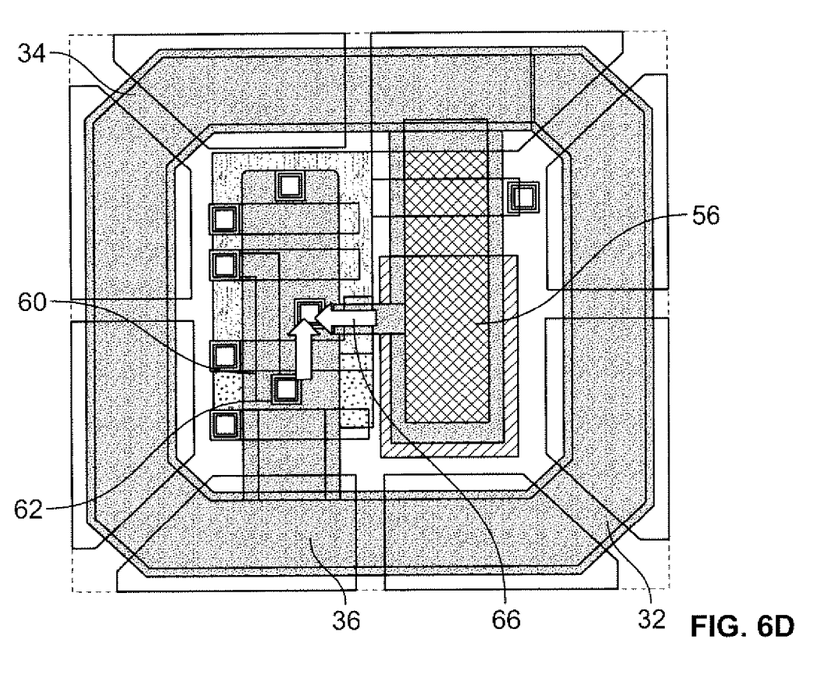

To achieve an effective noise floor of less than 1-2 e RMS at high video rates, the total gain of the present invention is targeted to about 40-100 ×. Referring now to FIG. 5, measured charge multiplication gain as a function of clock amplitude is shown for first generation test structures implemented with a much larger stage length, in a less advanced process technology. The charge multiplication gain in the pixel 30 is sensitive to the clock voltage amplitude of the phase 2 clock gate 80 and the temperature. The data in FIG. 5 show that the gain is about 43× for a 23.5 V clock amplitude and a temperature of 298K (25C) for this experimental test structure.

FIGS. 6A-6D illustrate the operation of the pixel 30 of FIGS. 3A and 3B. The pixel 30 is capable of snapshot operation, i.e., providing simultaneous integration of photocharge at all pixels in an array. In a first time period (FIG. 6A), a charge packet 82 accumulated in the pinned photodiode (PPD) 56 is loaded into the EM gain register 36 via the PPD transfer gate 58 (TR1). In a second time period (FIG. 6B), the charge packet 82 circulates around the EM gain register 36 through the EM gain regions 32, 34. As a result, the charge packet 82 circulating around EM gain register 36 accumulates nominally about 400 transfers through the EM gain regions 32, 34 (200 cycles). In a third time period (FIG. 6C), the amplified charge packet 82 is transferred to the floating diffusion sense node 60 by means of the floating diffusion transfer gate 62 where the charge packet is converted to a voltage, the floating diffusion sense node 60 acting like a capacitor. In a fourth time period (FIG. 6D), the floating diffusion sense node 60 and the PPD 56 are reset (global reset) via the PPD reset gate 66. Then the sequence is repeated for the next frame.

Figure 7:
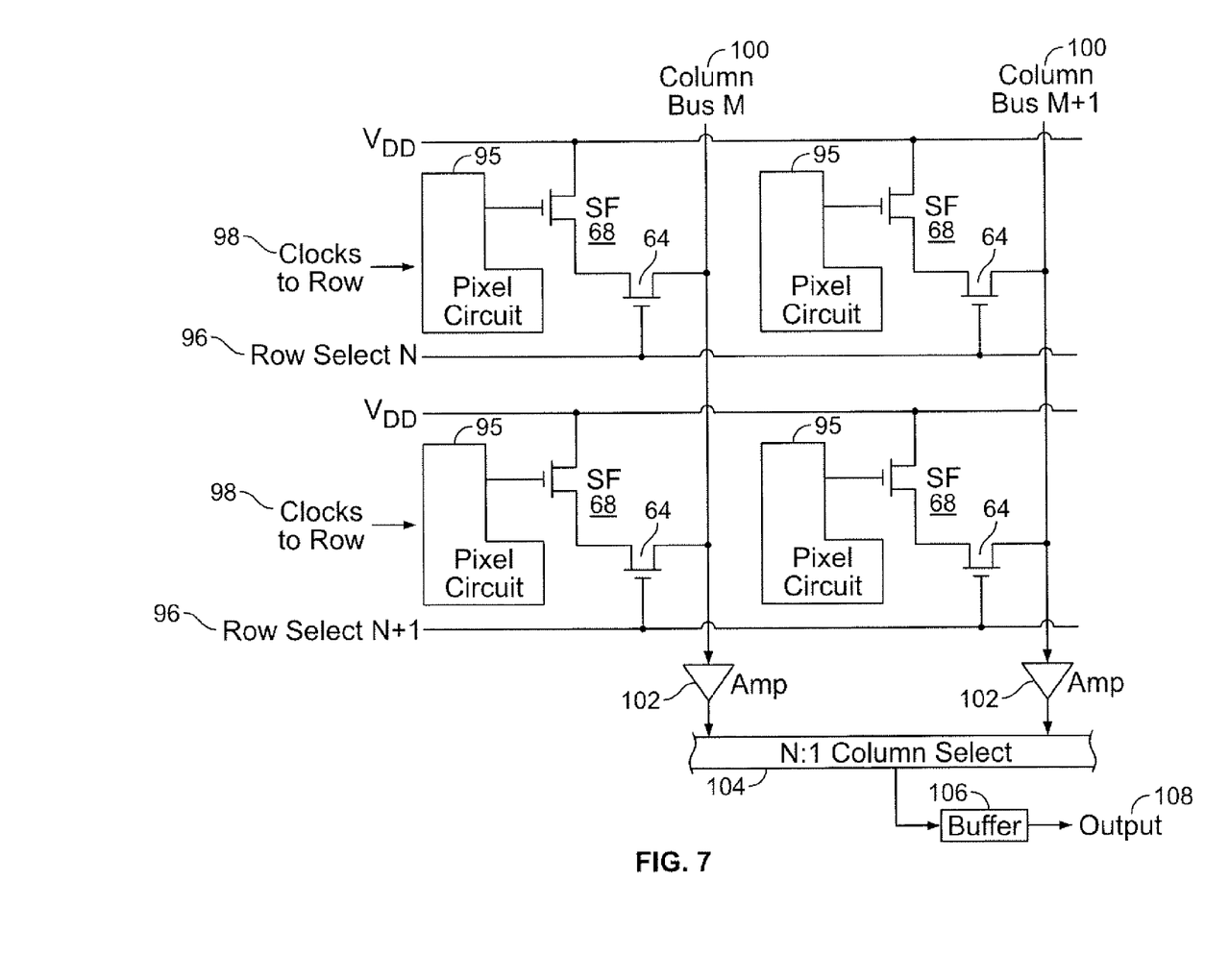
FIG. 7 is an electrical schematic diagram of an EMCMOS pixel array constructed in accordance with the device of FIGS. 3A and 3B.

FIG. 7 shows an electrical schematic diagram of a two dimensional array of EMCMOS pixels configured as an imaging array. The pixels 30 include the source follower transistor 68 and the row select transistor 64 that would be found in a typical CMOS design, along with pixel circuitry 95 which includes the EM gain register 36, the PPD 56, and the other readout circuits 54. Row drivers (not shown) are needed to drive the row selection lines 96, and the EM register clocks (shown as clocks to rows 98) are required. After selecting a row via the row select transistor 64 with one of the row selection lines 96, the voltages present on the floating diffusion sense nodes 60 of the pixel circuitry 95 are buffered and transferred though the selected source follower transistors 68. This places the selected voltages on the column buses 100. The voltages now present on the column buses 100 are applied to a plurality of column bus amplifiers 102. Typically, the column buses 100 have resistor loads or current source loads as part of the amplifier design. A particular output signal voltage is selected from a single pixel by means of an N:1 column select multiplexer 104. The output of the multiplexer is buffered by the buffer 106 and read in the output 108.

It is to be understood that the exemplary embodiments are merely illustrative of the invention and that many variations of the above-described embodiments may be devised by one skilled in the art without departing from the scope of the invention. It is therefore intended that all such variations be included within the scope of the following claims and their equivalents.

What is claimed is:

1. A pixel for an imager, comprising:
   at least one electron multiplication (EM) gain stage configured in a loop and electrically coupled to a charge collection region and a charge readout region, said charge collection region being configured to generate a charge packet, said EM gain stage being configured to amplify the charge packet by impact ionization and to circulate the charge packet a predetermined number of times in one direction around said loop, said charge readout region being configured to receive the amplified charge packet and convert the amplified charge to a measurable signal,
   wherein said at least one EM gain stage comprises:
      a first clocked gate,
      a second clocked gate,
      a DC gate formed between said first clocked gate and said second clocked gate, and
      a second DC gate formed proximal to said first clocked gate and distal to said second clocked gate,
   wherein said first DC gate and said second DC gate are combined with a step potential profile under said first clocked gate and said second clocked gate so as to set a direction of flow of the charge packet around said loop.

2. The pixel of claim 1, wherein said at least one EM gain stage, said charge collection region, and said charge readout region are formed monolithically in an integrated circuit.

3. The pixel of claim 1,
   wherein when a first voltage is applied to said first clocked gate, a first charge well is formed below said first clocked gate; when a second voltage greater than the first voltage is applied to said second clocked gate, a second charge well that is deeper than said first charge well is formed below said second clocked gate; when a DC voltage less than the first and second voltages is applied to the DC gate, a charge barrier is formed between said first charge well and said second charge well; and when a third potential is applied to said first clocked gate that is less than said DC voltage, the charge packet undergoes impact ionization as it transfers from said first charge well to said second charge well.

4. The pixel of claim 2, wherein said integrated circuit is manufactured using a CMOS process.

5. The pixel of claim 2, further comprising a second EM gain stage formed in said integrated circuit with said first EM gain stage in a loop.

6. The pixel of claim 1, wherein said charge collection region further comprises one of a pinned photodiode (PPD), a photogate, and a conventional photodiode.

7. The pixel of claim 1, wherein said charge readout region further comprises a floating diffusion sense node and a transfer gate for transferring the charge packet from said EM gain stage to said floating diffusion sense node.

8. The pixel of claim 7, wherein said readout structure further comprises:
   a source follower transistor electrically connected to said floating diffusion sense node;
   a row select gate electrically connected to said source follower transistor; and
   a source follower reset gate electrically connected to said source follower transistor.

9. The pixel of claim 1, wherein an optically opaque shield is placed substantially overlying said EM gain stage and said charge readout region.

10. The pixel of claim 9, further comprising a color filter placed substantially overlying said charge collection region.

11. The pixel of claim 9, further comprising a microlens placed substantially overlying said charge collection region.

12. The pixel of claim 1, further comprising a substrate substantially underlying the EM gain stage and said charge readout region, said EM gain stage and said charge readout region being placed in a doped well of higher doping than the substrate doping.

13. The pixel of claim 12, further comprising a color filter placed substantially underlying said substrate.

14. The pixel of claim 12, further comprising a microlens placed substantially underlying said substrate.

15. An imaging array, comprising:
   a plurality of pixels, each pixel comprising:
   at least one electron multiplication (EM) gain stage configured in a loop and electrically coupled to a charge collection region and a charge readout region, said charge collection region being configured to generate a charge packet, said EM gain stage being configured to amplify the charge packet by impact ionization and to circulate the charge packet a predetermined number of times in one direction around said loop, said charge readout region being configured to receive the amplified charge packet and convert the amplified charge to a measurable signal,
   wherein said at least one EM gain stage comprises:
   a first clocked gate,
   a second clocked gate,
   a DC gate formed between said first clocked gate and said second clocked gate, and
   a second DC gate formed proximal to said first clocked gate and distal to said second clocked gate,
   wherein said first DC gate and said second DC gate are combined with a step potential profile under said first clocked gate and said second clocked gate so as to set a direction of flow of the charge packet around said loop;
   at least one row selection line coupled to at least one charge readout region; and
   at least one amplifier for receiving and amplifying the measurable signal from said at least one charge readout region selected by said at least one row selection line.

16. The imaging array of claim 15, wherein said at least one EM gain stage, said charge collection region, and said charge readout region are formed monolithically in an integrated circuit.

17. The imaging array of claim 15, further comprising:
   a column select multiplexer coupled to said at least one charge readout region; and
   an output buffer coupled to said column select multiplexer.

18. The imaging array of claim 15,
   wherein when a first voltage is applied to said first clocked gate, a first charge well is formed below said first clocked gate; when a second voltage greater than the first voltage is applied to said second clocked gate, a second charge well that is deeper than said first charge well is formed below said second clocked gate; when a DC voltage less than the first and second voltages is applied to the DC gate, a charge barrier is formed between said first charge well and said second charge well; and when a third potential is applied to said first clocked gate that is less than said DC voltage, the charge packet undergoes impact ionization as it transfers from said first charge well to said second charge well.

19. The imaging array of claim 15, wherein said plurality of pixels is manufactured using a CMOS process.

20. The imaging array of claim 15, wherein each of said pixels further comprises a second EM gain stage formed with said first EM gain stage in a loop.

21. The imaging array of claim 15, wherein said charge collection region further comprises one of a pinned photodiode (PPD), a photogate, and a conventional photodiode.

22. The imaging array of claim 15, wherein said charge readout region further comprises a floating diffusion sense node and a transfer gate for transferring the charge packet from said EM gain stage to said floating diffusion sense node.

23. The imaging array of claim 15, wherein said charge readout region further comprises:
   a source follower transistor electrically connected to said floating diffusion sense node;
   a row select gate electrically connected to said source follower transistor; and
   a source follower reset gate electrically connected to said source follower transistor.

* * * * *